United States Patent
Franken et al.

(10) Patent No.: US 10,822,701 B2
(45) Date of Patent: Nov. 3, 2020

(54) CVD OR PVD REACTOR FOR COATING LARGE-AREA SUBSTRATES

(71) Applicant: AIXTRON SE, Herzogenrath (DE)

(72) Inventors: Walter Franken, Eschweiler (DE); Bernhard Zintzen, Aachen (DE); Henricus Wilhelmus Aloysius Janssen, Sint Anthonis (NL)

(73) Assignee: AIXTRON SE, Herzogenrath (DE)

( * ) Notice: Subject to any disclaimer, the term of this patent is extended or adjusted under 35 U.S.C. 154(b) by 194 days.

(21) Appl. No.: 15/528,476

(22) PCT Filed: Nov. 18, 2015

(86) PCT No.: PCT/EP2015/076972
§ 371 (c)(1),
(2) Date: May 19, 2017

(87) PCT Pub. No.: WO2016/079184
PCT Pub. Date: May 26, 2016

(65) Prior Publication Data
US 2017/0314134 A1    Nov. 2, 2017

(30) Foreign Application Priority Data
Nov. 20, 2014   (DE) .................. 10 2014 116 991

(51) Int. Cl.
*C23C 16/54* (2006.01)
*B01J 3/02* (2006.01)
(Continued)

(52) U.S. Cl.
CPC .............. *C23C 16/545* (2013.01); *B01J 3/02* (2013.01); *B01J 3/03* (2013.01); *C23C 14/12* (2013.01);
(Continued)

(58) Field of Classification Search
CPC ............ C23C 16/545; C23C 16/45563; C23C 16/45565; C23C 16/52; C23C 14/12; C23C 14/54; C23C 14/562
See application file for complete search history.

(56) References Cited

U.S. PATENT DOCUMENTS

| | | | |
|---|---|---|---|
| 2008/0050536 A1 * | 2/2008 | Aing .................. | C23C 16/4409 427/569 |
| 2008/0317973 A1 * | 12/2008 | White .............. | C23C 16/45565 427/569 |

(Continued)

FOREIGN PATENT DOCUMENTS

| | | | | |
|---|---|---|---|---|
| DE | 2361744 A1 * | 7/1974 | .......... | C03C 17/002 |
| DE | 2361744 A1 | 7/1974 | | |

(Continued)

OTHER PUBLICATIONS

Written Opinion dated Apr. 4, 2016, from the European Patent Office, for International Patent Application No. PCT/EP2015/076972 (filed Nov. 18, 2015), English Translation, 6 pages.

(Continued)

*Primary Examiner* — Kelly M Gambetta
(74) *Attorney, Agent, or Firm* — Ascenda Law Group, PC

(57) ABSTRACT

A CVD or PVD coating device comprises a housing and a gas inlet organ secured to the housing via a retaining device, the gas inlet organ having a gas outlet surface with gas outlet openings. The retaining device is only secured at its horizontal edge to the housing so as to stabilize the retaining device with respect to deformations and temperature. The gas inlet organ is secured, at a plurality of suspension points, to the retaining device by means of a plurality of hanging elements distributed over the entire horizontal surface of the retaining device. The retaining device has mechanical stabilization elements formed by a retaining frame having vertical walls that are interconnected at vertical connection (Continued)

lines. An actively cooled heat shield is situated between the retaining device and the gas inlet organ.

12 Claims, 4 Drawing Sheets

(51) Int. Cl.
    *B01J 3/03*     (2006.01)
    *C23C 14/12*     (2006.01)
    *C23C 14/56*     (2006.01)
    *C23C 16/455*     (2006.01)
    *C23C 14/54*     (2006.01)
    *C23C 16/52*     (2006.01)

(52) U.S. Cl.
    CPC ............ *C23C 14/54* (2013.01); *C23C 14/562* (2013.01); *C23C 16/45563* (2013.01); *C23C 16/45565* (2013.01); *C23C 16/52* (2013.01)

(56) References Cited

U.S. PATENT DOCUMENTS

2009/0095220 A1*   4/2009   Meinhold ......... C23C 16/45565
                                                        118/712
2009/0250008 A1   10/2009   Matsushima et al.
2014/0306027 A1*  10/2014   Xu .................... C23C 16/45565
                                                        239/132.3

FOREIGN PATENT DOCUMENTS

DE     102013101534 A1     8/2014
EP        1815493 A1     8/2007

OTHER PUBLICATIONS

International Preliminary Report on Patentability dated May 23, 2017, from the International Bureau of WIPO, for International Patent Application No. PCT/EP2015/076972 (filed Nov. 18, 2015), 8 pages.

International Preliminary Report on Patentability dated May 23, 2017, from the International Bureau of WIPO, for International Patent Application No. PCT/EP2015/076972 (filed Nov. 18, 2015), English Translation, 7 pages.

International Search Report dated Apr. 4, 2016, from the European Patent Office, for International Patent Application No. PCT/EP2015/076972 (filed Nov. 18, 2015), 5 pages.

Written Opinion dated Apr. 4, 2016, from the European Patent Office, for International Patent Application No. PCT/EP2015/076972 (filed Nov. 18, 2015), 7 pages.

* cited by examiner

CVD OR PVD REACTOR FOR COATING LARGE-AREA SUBSTRATES

RELATED APPLICATIONS

This application is a National Stage under 35 USC 371 of and claims priority to International Application No. PCT/EP2015/076972, filed 18 Nov. 2015, which claims the priority benefit of DE Application No. 10 2014 116 991.3, filed 20 Nov. 2014.

FIELD OF THE INVENTION

The invention relates to a CVD or PVD coating device with a housing and a gas inlet organ that is secured to the housing and has a gas outlet surface exhibiting gas outlet openings, with a retaining device secured to an upper section of the housing, to which the gas inlet organ is secured at a plurality of suspension points.

BACKGROUND

A generic coating device is described in EP 1 815 493 B1, which shows a housing of a coating device, in which is arranged a retaining device containing a gas inlet organ. A similar device is described in US 2008/0317973 A1.

DE 2361744 A describes a gas inlet organ for a CVD reactor, in which a gas inlet organ sits under a gas supply device provided with a heater. The process gas is transported through tubes to a gas outlet opening. The tubes comprise the retaining elements, with which the gas inlet organ is secured to a gas supply device.

US 2009/0250008 A1 also describes a CVD reactor. A showerhead has a gas outlet surface comprised of a gas outlet plate. Provided at the edge of the gas outlet plate is an annular body with a channel, through which a coolant can flow. Also provided are heating elements, with which the annular body can be heated.

A generic coating device has a susceptor for accommodating the substrate to be coated and a gas inlet organ that performs the function of a gas distributor, with which process gases can be introduced into a process chamber that extends between an underside of the gas distributor and the susceptor. The underside of the gas distributor has a plurality of gas outlet openings, through which the process gas can enter into the process chamber. Located inside of the gas distributor are chambers for distributing the process gas to the gas outlet openings. A gas distributor of this type is described in DE 10 2013 101 534 A1, for example.

SUMMARY OF THE INVENTION

In order to separate OLED's, gaseous, organic starting materials are fed into a heated gas distributor with the help of a carrier gas. The gaseous starting materials pass through the gas outlet openings into the process chamber, so as to condense onto a substrate that rests on the cooled susceptor for this purpose. The substrates can have a surface of more than 1 m². There exists a demand for manufacturing CVD or PVD reactors with a susceptor diagonal of 2 m to 3 m. Since the gas inlet organ must extend over the entire surface of the susceptor, there exists a need to create a gas inlet organ with a diagonal of 2 m to 3 m. The process chamber has a process chamber height of a few centimeters. In order to be able to separate a layer with a constant layer thickness and constant layer quality over the entire substrate surface, it is necessary that the process chamber height assume a constant value within several tolerances over the entire process chamber. The separating process takes place in the low-pressure range, i.e., in a range in which the atmospheric pressure exposes the housing walls to significant deformation forces. The housing cannot be prevented from deforming while decreasing the pressure. In addition, the gas inlet organ is heated, so that thermal expansion phenomena must be taken into account in addition to the mechanical forces.

The object of the invention is to further develop a generic coating device in such a way that the process chamber height only varies within narrow tolerances over the entire surface of the susceptor or gas outlet surface of the gas inlet organ.

The object is achieved by the invention indicated in the claims, wherein each claim basically represents an independent solution to the object.

Initially and essentially proposed is a retaining device that is secured to an upper section of the housing. A temperature stabilizable or mechanically stabilized retaining device is involved. The gas inlet organ is secured at a plurality of suspension points on this dimensionally stabilized retaining device. The suspension points are essentially uniformly distributed over the entire extension surface of the gas inlet organ. The distance between the suspension points is smaller than the diagonal extension of the gas inlet organ by at least a factor of 3, but preferably by a factor of 4 or a factor of 5. Especially preferred is a maximum distance between two adjacent suspension points that can measure at most one tenth of the diagonal extension of the gas inlet organ. The retaining device can have mechanical stabilization elements for mechanical stabilization. These mechanical stabilization elements can consist of vertical walls. The retaining device preferably forms a framework comprised of crossing vertical walls. The distance between two vertical walls running vertically and possibly even parallel to each other is smaller than the diagonal distance of the gas inlet organ by at least a factor of 3, a factor of 4, but preferably a factor of 5. Cylindrical cells extending in the vertical direction form, with a base area preferably corresponding to at most one hundredth of the base area of the gas inlet organ, and can have a chessboard or honeycomb layout. The retaining device is preferably secured to the housing exclusively with an area bordering its horizontal edge. It is the horizontal edge of the retaining device that is secured to the housing. The entire central surface section of the retaining device freely spans the gas inlet organ, but has a retaining connection to the gas inlet organ at a plurality of points essentially uniformly distributed over the surface. The retaining device is temperature stabilized. To this end, an active or passive temperature stabilization device can be provided. The retaining device is temperature stabilized in such a way that its temperature does not significantly change in either the horizontal direction or the vertical direction given a change in the temperature difference relative to the gas inlet organ. The temperature inside the entire body formed by the retaining device, i.e., preferably the framework, preferably varies by +/−5 degrees. The temperature difference between the coldest point and hottest point preferably measures at most 5 degrees. Protective heat shields, for example with reflective surfaces or insulating bodies, can be provided for passive temperature stabilization. Active temperature stabilization can be realized using temperature control media, for example temperature control liquids, which flow through temperature control channels. The temperature control channels can be arranged inside of the retaining device. However, the temperature control channels are preferably provided above or below the retaining device. If the retaining device must be cooled for temperature control purposes because the temperature of the gas inlet organ is kept at a high temperature during the coating process, use is preferably made of an active temperature control element arranged in the area between the gas inlet organ and retaining device. The honeycomb or boxlike structure of the retaining device that imparts the shape of a framework thereto further leads to a mechanical stabilization. As a result, a dimensional change in the housing upper part that might arise given a change in internal pressure does not influence the shape of the retaining device. The fastening means can involve elastic fastening means, with which the edge area of the retaining device is secured to the housing. In a preferred configuration, a vertical space extends between the gas inlet organ and retaining device. A plurality of hangers is used for securing the gas inlet organ to the retaining device. The hangers can be elongated metallic or ceramic tension elements, whose upper end is secured to the retaining device, and whose lower end is secured to a fastening point of the gas inlet organ. The hangers can be height-adjustable. In this way, the distance between the gas outlet surface and susceptor upper side, i.e., the process chamber height, can be set at each suspension point. The hangers are preferably made out of a material having a low thermal expansion coefficient. The walls of the gas inlet organ are provided with temperature control channels. In particular, the wall of the gas inlet organ comprising the gas outlet surface, but also the wall facing away from the latter, is provided with channels through which a temperature control medium, for example a hot liquid, can flow. Not just the shape of the retaining device helps to stabilize its temperature. The retaining device is designed as a lightweight component. The measures taken to actively diminish heat transport from the gas inlet organ to the retaining device can comprise arranging one or several heat shields in the space between the gas inlet organ and retaining device. The heat shields are surface objects located parallel to the surface extension of the gas inlet organ in the space. Their surfaces can be highly reflective. Alternatively thereto, insulating bodies can also be arranged in the space. At least one heat shield can be actively cooled. The actively cooled heat shield is preferably immediately adjacent to the retaining device. The actively cooled heat shield can be a plate, whose surface extension roughly corresponds to the surface extension of the retaining device or the surface extension of the gas inlet organ. Coolant channels run inside the plate, through which a coolant can flow. As a result, the retaining device can be kept at a constant temperature. If the gas inlet organ is heated, the retaining device essentially retains its temperature. The distance by which the process chamber height can change during operation of the device lies at under 1 mm. The surface temperature of the housing lies at about 30° C. The temperature of the retaining device can be stabilized to a value of 50° C. To this end, the active heat shield is cooled to a temperature of about 50° C. The showerhead is operated at a temperature of 450°, for example, and the substrate is cooled to a temperature of 20°. One or several passive heat shields located between the active heat shield and gas inlet organ reduce the heat flow from the gas inlet organ to the actively cooled heat shield. A heat shield directly adjacent to the gas inlet organ can exhibit a surface temperature of 350°, for example. The heat shield can consist of metal or a ceramic material. Another passive heat shield can be arranged between this passive heat shield and the active heat shield, and also be comprised of a metal plate or ceramic plate. Its temperature during operation lies at about 270° C. More than two passive heat shields can also be provided between the gas inlet organ and actively cooled heat shield. The surfaces of the heat shields can have a low optical emissivity. They can be polished, reflecting surfaces. The hangers can be used to hold the heat shields. However, it is also provided that the hangers extend only through openings in the heat shields, so that a deformation of heat shields does not affect the position of the gas inlet organ in the space. According to the invention, the retaining device is stabilized against deformations. Involved here are deformations caused by a changing temperature and/or by a changing pressure. The heat shields can be suspended on separate suspension devices, which are secured either to the housing cover or on the retaining device. The invention further relates to a method for operating such a device. In particular, the invention relates to a CVD or PVD device with a housing, with a retaining device secured to an upper section of the housing, and a temperature controllable gas inlet organ with a gas outlet surface exhibiting gas outlet openings, with the gas inlet organ being secured to the retaining device at a plurality suspension points. The temperature of the retaining device can be stabilized by an actively temperature controllable temperature control device. It is essential that the temperature control device be arranged between the gas inlet organ and retaining device in relation to a vertical direction. The invention further relates to a CVD or PVD coating device with a housing, with a retaining device secured to an upper section of the housing and a gas inlet organ with a gas outlet surface exhibiting gas outlet openings, with the gas inlet organ being secured to the retaining device at a plurality of suspension points. It is essential that the retaining device exhibit a cell structure. The cell structure has cell walls extending in a vertical direction and a horizontal cell surface, which measures at most one twenty fifth, preferably at most one hundredth, of the base area of the retaining device.

BRIEF DESCRIPTION OF THE DRAWINGS

Exemplary embodiments of the invention will be described below based on the attached drawings. Shown on.

DETAILED DESCRIPTION

Figure 1:
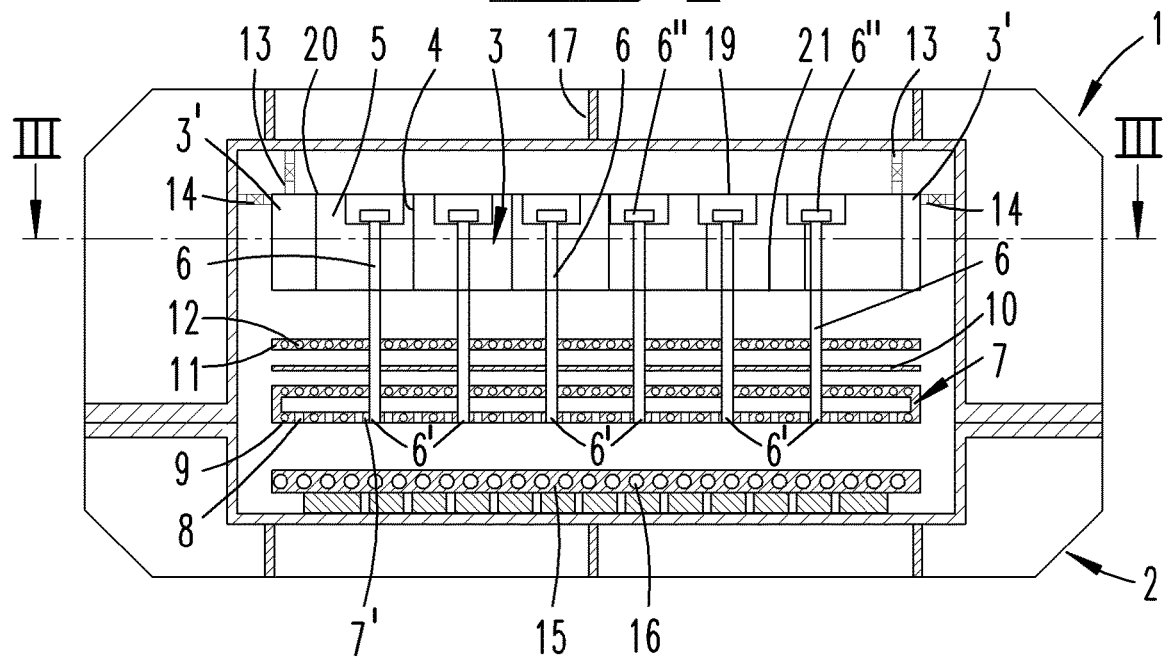
FIG. 1 is a section along the I-I line on FIG. 2 through a schematically depicted PVD coating device.
Figure 2:
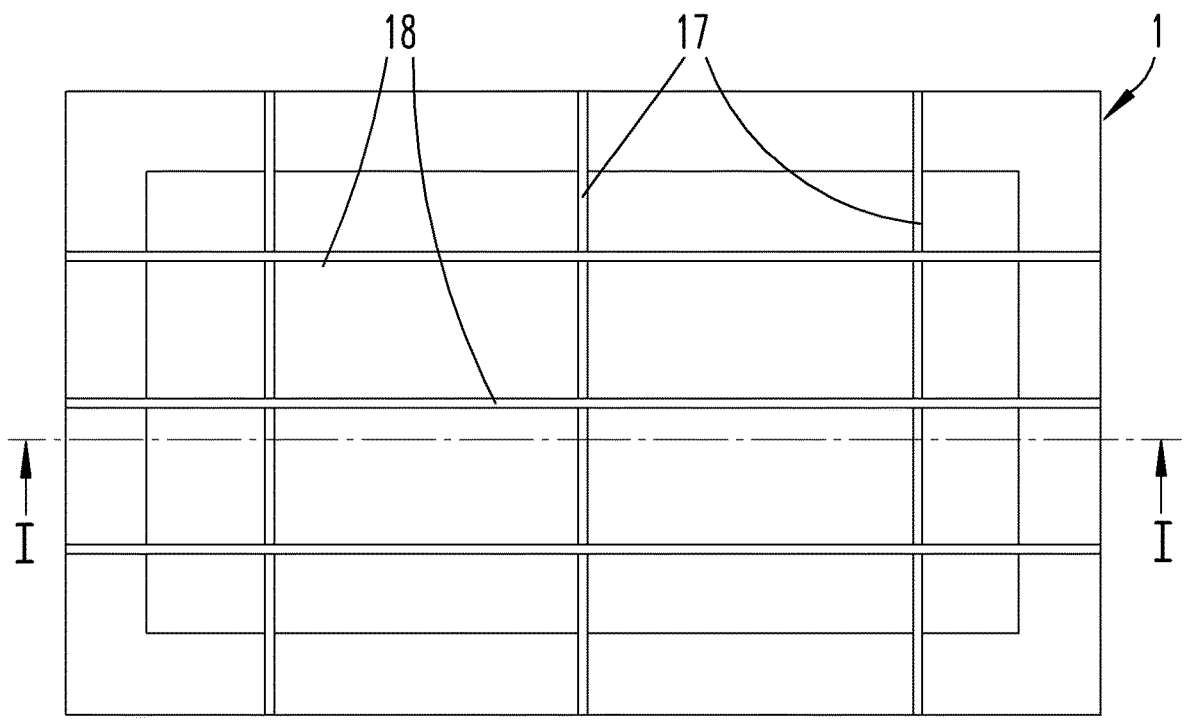
FIG. 2 is a top view of the coating device.
Figure 3:
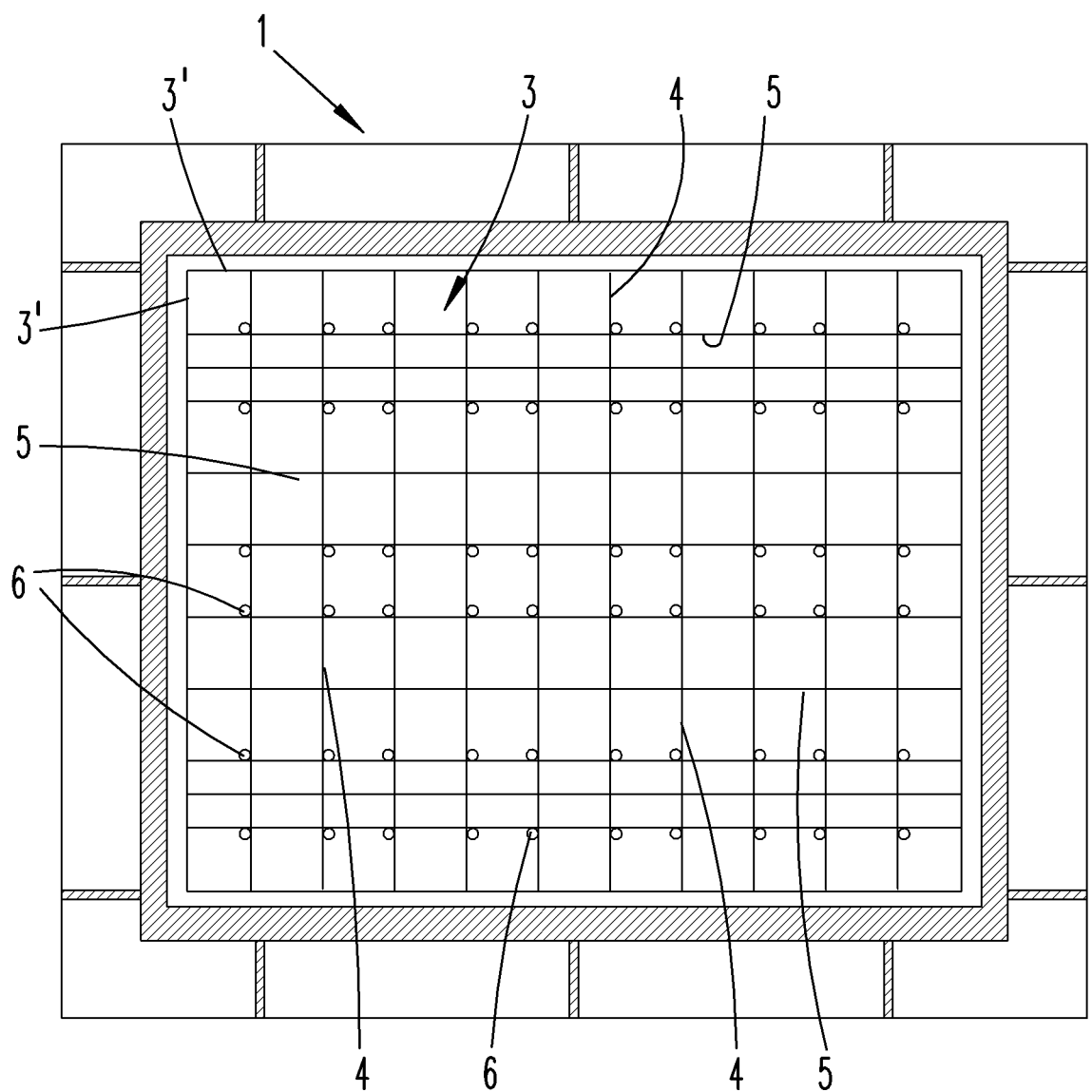
FIG. 3 is the section according to the III-III line on FIG. 1.

The device shown on FIGS. 1 to 3 is a PVD device for coating large-surface substrates with organic layers. The substrates can have a rectangular shape, with a diagonal of more than 1 m, preferably of more than 2 m or 3 m. The housing lower part 2 carries a susceptor 15 for supporting the substrate. The susceptor 15 has a plurality of coolant channels 16, through which a coolant can be introduced into the process chamber. The susceptor is kept at a temperature of about 20° C. by the coolant.

The upper part 1 of the housing has a housing cover, which is mechanically stabilized by a rib structure 17, 18. The housing lower part 2 has a similar rib structure for mechanically stabilizing the housing floor. Temperature control channels can be arranged in the housing cover, through which a liquid temperature control medium flows in order to keep the housing cover at a prescribed temperature.

Fastening means 13, 14 are provided at the edge of the housing cover and at the edge of the side wall of the housing upper part 1. These are elastic fastening means 13, 14, with which a retaining device 3 is secured to the housing upper part 1 at its horizontal edge.

The retaining device 3 is a lightweight component in the form of a framework or a honeycomb structure. It has a plurality of surface elements 4, 5 interconnected along vertical connection lines. The surface elements 4, 5 form vertical walls. In the exemplary embodiment, the retaining device 3 is comprised of a retaining frame that forms crossing vertical walls 4, 5, and is secured to the housing 1 with its edge 3' via the fastening means 13, 14. Since the retaining device 3 is only secured to the housing 1 on its edge 3', an unavoidable bending of the housing cover given a pressure change inside of the housing 1, 2 does not lead to any relevant change in position of the retaining device 3 inside of the housing 1, 2. The entire central surface area of the retaining device 3 enveloped by the edge 3' freely undergirds the cover wall of the housing upper part running parallel thereto. The fastening means 13, 14 are secured to the edge of the cover wall of the housing upper part 1. The retaining device 3 forms an open or closed cell structure, wherein the horizontal surfaces of the cells are smaller than the horizontal surface of the retaining device 3 by a factor of at least 100. The vertical height of a surface can lie within the order of magnitude of a circle equivalent diagonal of the horizontal surface of the cell.

A gas inlet organ 7 in the form of a hollow body whose walls exhibit temperature control channels 9 is arranged vertically above the susceptor 15. The distance between the underside of the gas inlet organ 7 comprising a gas outlet surface 7' and the upper side of the susceptor 15 measures a few centimeters. The gas outlet surface 7' has a plurality of gas outlet openings 8 arranged like showerheads, through which process gases can flow out of the hollow space of the gas inlet organ 7 into the process chamber, which consists of the upper side of the susceptor 15 and underside of the gas inlet organ 7. The gas inlet organ 7 is temperature controlled to temperatures of about 450° C.

The gas inlet organ 7 is fastened to the retaining device 3 with mechanical fastening elements 6. The mechanical fastening elements 6 are essentially uniformly distributed over the entire extension surface of the gas inlet organ 7. The distances between adjacent fastening elements 6 are significantly smaller than an edge length of the diagonal of the gas inlet organ 7. The maximum distance between two adjacent fastening elements 6 preferably measures less than one tenth of the circle equivalent diagonal of the gas inlet organ.

The mechanical fastening elements are hangers 6, which are fastened to the retaining device 3 with a head 6", and extend over a vertical space to the gas inlet organ 7. The hangers 6 are there fastened to the gas inlet organ 7 with their feet at suspension points 6'. The gas inlet organ 7 has two walls extending parallel to each other, which each exhibit temperature control channels 9. The fastening points 6' can be provided on the upper wall of the gas inlet organ 7. In the exemplary embodiment, however, the fastening points 6' are provided on the wall of the gas inlet organ 7 exhibiting the gas outlet openings 8. Therefore, the feet of the hangers 6 are there fastened to the lowermost wall of the gas inlet organ 7.

The heads 6" of the hangers 6 are mounted in openings or recesses 19 in the upper side of the retaining device 3. The heads 6" can consist of screws twisted into threads, so that the length of the hangers 6 or vertical position of the suspension points 6' can be changed by turning the heads 6". However, the heads 6" can also be comprised of nuts or other adjusting elements, with which the vertical position of the gas inlet organ can be locally adjusted. In this way, the height of the process chamber can be locally preset. The hangers 6 preferably consist of a material having only a slight thermal expansion coefficient, so that heating the hanger 6 does not impact the local height of the process chamber.

In a preferred configuration also realized in the exemplary embodiment shown on FIGS. 1 and 3, the retaining device 3 involves not just a mechanically stabilized retaining frame, but also a temperature-stabilized retaining frame. To this end, an actively temperature controlled heat shield is located directly under the retaining device 3. The heat shield 11 is a plate comprised of metal or ceramic, with coolant channels 12. A coolant is passed through these coolant channels 12, which brings the actively cooled heat shield 11 to a temperature of about 50°.

One or more passive heat shields can be arranged between the actively cooled heat shield 11 and the gas inlet organ 7. The exemplary embodiment provides a passive heat shield 10, which can also be a metal plate or ceramic plate. The passive heat shield has a temperature ranging between the temperature of the gas inlet organ and the temperature of the active heat shield. The temperature of the passive heat shield can range between 400° and 200°. When using several passive heat shields arranged parallel to each other, the individual heat shields can have temperatures of 270° or 350°. The temperature of the retaining device is thereby kept at about 50°. The housing temperature then lies at about 30° C. The passive heat shields 10 are preferably metal plates with highly reflective surfaces. Their emission coefficient lies at less than 0.2.

Figure 4:
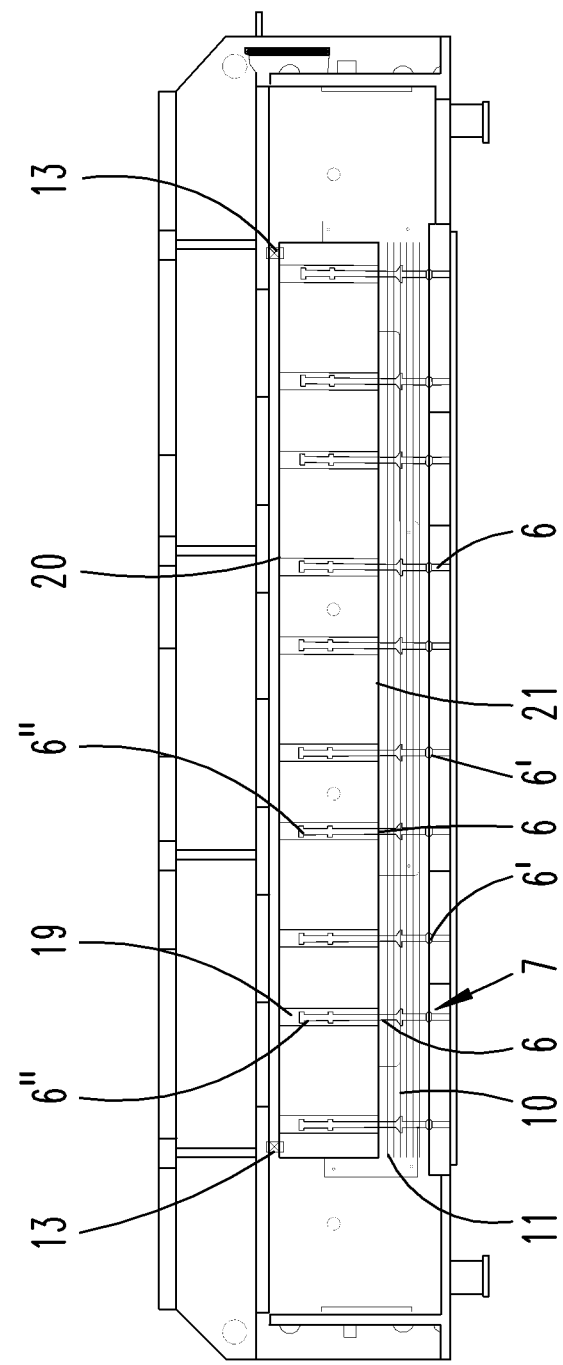
FIG. 4 is the housing upper part of a PVD reactor of a second exemplary embodiment in a sectional view roughly according to FIG. 1.
Figure 5:
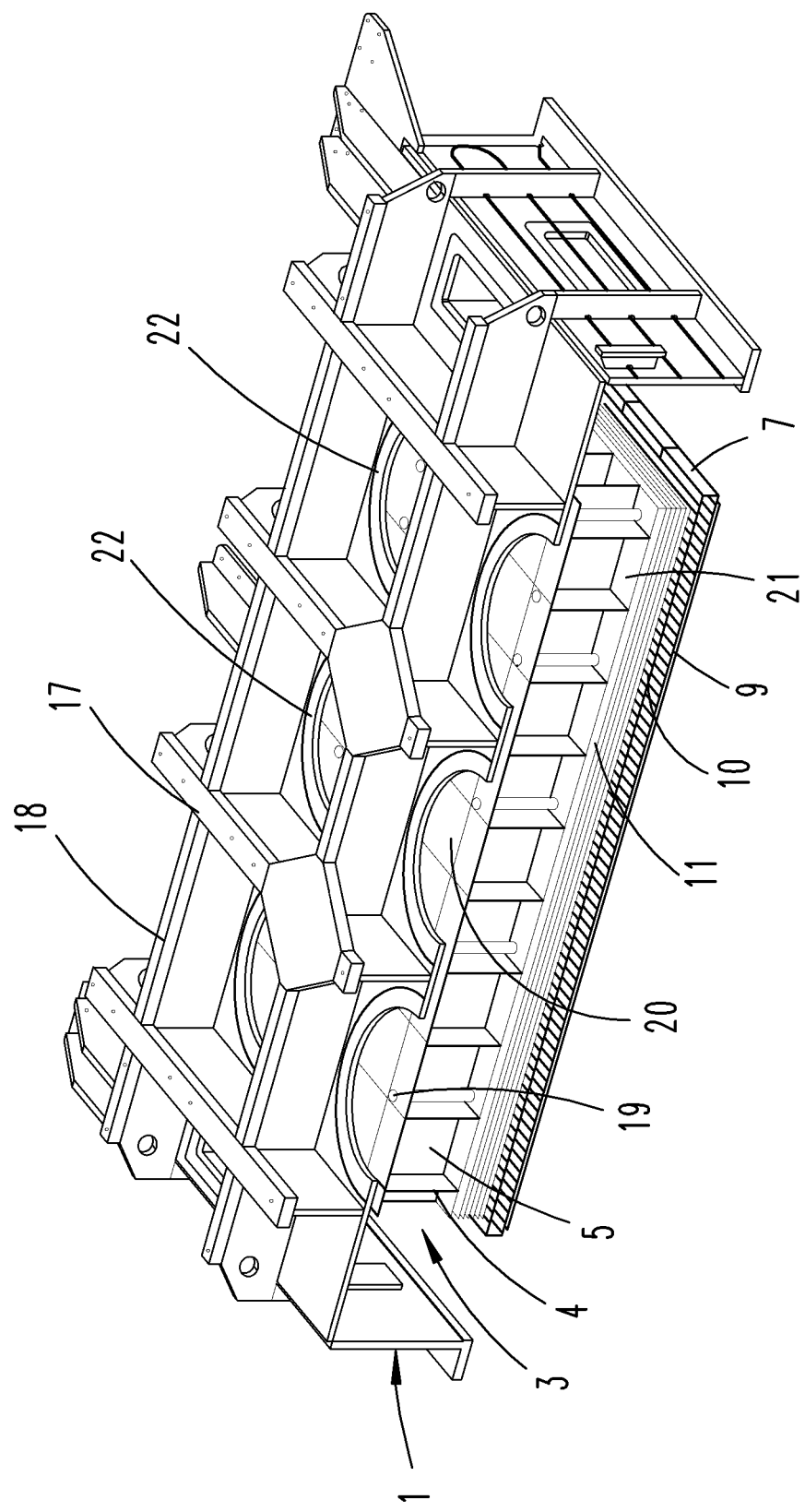
FIG. 5 is the cut housing upper part according to FIG. 4 in a perspective view.

The second exemplary embodiment of a housing upper part 1 shown on FIGS. 4 and 5 also has a retaining frame designed as a lightweight component, which consists of a lattice-like chamber structure, wherein vertical chamber walls 4, 5 are joined together at vertical connection lines. The chamber walls 4, 5 can consist of thin metal plates here as well. In addition, the retaining frame 3 there also has a horizontally running upper horizontal wall 20 and a lower horizontal wall 21.

In this exemplary embodiment as well, only the vertical continuous edge 3' of the retaining device 3 is connected with the housing. The respective fastening means 13 can be elastic fastening means. All walls of the retaining device 3 consist of the thinnest sheet materials, such as metal sheets. An open or closed-cell spatial structure forms. The retaining device 3 is fastened at the edge of a cover plate of the housing upper part 1.

A gas inlet organ 7 with a plurality of gas outlet openings is fastened to the retaining device 3 by a plurality of fastening points 6' arranged essentially uniformly over the extension surface of the gas inlet organ 7. Mechanical fastening elements are connected, which here as well consist of hangers. The head 6" of the hanger 6 is connected with the retaining device 3. The foot of the hanger 6 is connected with the gas inlet organ 7 at the fastening points 6'. Here as well, several heat protective shields 10, 11 are located between the retaining device 3 and gas inlet organ 7 in the vertical space. At least one actively cooled heat protective shield 11 is provided here as well, which is arranged directly below the retaining device and extends parallel to the underside of the retaining device 3. A plurality of passive heat protective shields 10 running parallel to each other extend between the actively cooled heat shield 11 and the upper side of the gas inlet organ 7.

In the exemplary embodiment, the heat protective shields are connected with the hangers 6. The hangers 6 thus not only hold the gas inlet organ 7 on the retaining device 3, but hold the heat protective shields 10, 11 in their vertical position. However, the heat protective shields 10, can also be secured to the retaining device 3 with separate hangers. They have highly reflective surfaces. Arranged under the retaining device 3 is a plate 11, which extends over the entire surface extension of the retaining device 3, and has coolant channels 12 through which the cooling water flows.

An exemplary embodiment (not shown) can provide that the heat protective shields 10, 11, whose vertical position is essentially uncritical, be directly fastened to the housing via separate suspension devices. Respective suspension devices can be provided on the edge of the heat protective shields 10, 11. However, they can also be provided in the central surface area of the heat protective shields 10, 11, and engage through passage openings in the retaining device 3, for example, so as to be secured to the cover of the housing upper part 1.

Sealable openings 22 are arranged in the cover section of the housing upper part 1 in the area between the reinforcing ribs 17, 18. Opening these openings 22 enables access to the upper side of the retaining device 3 or to the upper horizontal wall 20. Located there are the openings 19 in which the heads 6" of the hangers 6 are inserted. The heads 6" can consist of threaded parts, so that the effective length of the hangers 6 can be influenced by turning the heads 6". The heads 6" of the hangers thus comprise adjusting elements, so as to locally influence the height of the process chamber, i.e., the distance between the gas inlet organ 7 and susceptor 15.

The device described above is used to deposit OLED's on large-surface substrates. In this process, solid starting materials present in powder form are changed into a gaseous form with an evaporator. A carrier gas is used to convey the organic vapor generated in this way into the gas inlet organ 7, where the vapor exits the gas outlet openings 8, so as to condense on the surface of a substrate lying on the susceptor 15.

The above statements serve to explain the inventions encompassed by the application overall, which further develop prior art at least through the following feature combinations, and respectively also taken separately, specifically:

A CVD or PVD coating device, characterized by an actively temperature controllable temperature control device (11, 12), with which the temperature of the retaining device (3) can be stabilized.

A CVD or PVD coating device, characterized in that the temperature control device (11, 12) has temperature control medium channels (12).

A CVD or PVD coating device, characterized in that the temperature control device (11, 12) is arranged between the gas inlet organ (7) and retaining device (3).

A CVD or PVD coating device, characterized in that the retaining device has mechanical stabilization elements.

A CVD or PVD coating device, characterized in that the retaining device consists of a retaining frame exhibiting vertical walls interconnected at vertical connection lines.

A CVD or PVD coating device, characterized in that the retaining device is secured to the housing exclusively at its horizontal edge.

A CVD or PVD coating device, characterized in that the retaining device is secured to the housing with elastic fastening means.

A CVD or PVD coating device, characterized in that the gas inlet organ is secured to the retaining device with a plurality of hangers distributed over the entire horizontal extension surface, wherein the hangers extend in the vertical direction from the suspension points to the retaining device.

A CVD or PVD coating device, characterized in that one or several heat shields are arranged in a vertical space between the gas inlet organ and retaining device.

A CVD or PVD coating device, characterized in that the temperature control device (11) consists of one of the heat shields, which is immediately adjacent to the retaining device (3).

A CVD or PVD coating device, characterized in that two immediately adjacent suspension points are spaced apart from each other at most by one fifth of the circle equivalent diagonal of the gas inlet organ.

A CVD or PVD coating device, characterized in that the retaining device has a cell structure with cell walls extending in a vertical direction and a horizontal cell surface, which measures at most one twenty fifth, preferably at most one hundredth, of the base area of the retaining device.

A method for operating a CVD or PVD coating device, characterized in that the retaining device 3 is kept at a homogenous temperature by means of the temperature control device 11, 12, so that the coldest point of the retaining device differs by at most 5 degrees from the warmest point of the retaining device.

All disclosed features (taken separately, but also in combination with each other) are essential to the invention. The disclosure of the application hereby also includes the disclosure content of the accompanying/attached priority documents (copy of preliminary application) in its entirety, further with the purpose of also incorporating features in these documents into claims of the present application. The features in the subclaims characterize independent inventive further developments of prior art, in particular so as to initiate partial applications based upon these claims.

| REFERENCE LIST | |
|---|---|
| 1 | Housing upper part |
| 2 | Housing lower part |
| 3 | Retaining device |
| 3' | Edge |
| 4 | Vertical wall |
| 5 | Vertical wall |
| 6 | Fastening element |
| 6' | Suspension points |
| 6" | Head |
| 7 | Gas inlet organ |
| 7' | Gas outlet surface |
| 8 | Gas outlet opening |
| 9 | Temperature control channel |
| 10 | Passive heat shield |
| 11 | Active heat shield |
| 12 | Cooling medium channel |
| 13 | Fastening means |
| 14 | Fastening means |
| 15 | Susceptor |
| 16 | Cooling means channel |
| 17 | Rib |
| 18 | Rib |
| 19 | Opening |
| 20 | Upper horizontal wall |
| 21 | Lower horizontal wall |
| 22 | Opening |

What is claimed is:

1. A chemical vapor deposition (CVD) or physical vapor deposition (PVD) coating device, comprising:
   a housing (1, 2);
   a gas inlet organ (7) in a form of a hollow body, the gas inlet organ (7) having a hollow space disposed between a rear wall of the gas inlet organ (7) and a front wall of the gas inlet organ (7), wherein the front wall has a gas outlet surface (7') exhibiting gas outlet openings (8) arranged like a showerhead, and wherein the gas inlet organ (7) is provided with temperature control channels for heating the gas inlet organ (7) at a high temperature during a coating process;

a retaining device (3) secured to an upper section of the housing (1), wherein the gas inlet organ (7) is secured to the retaining device (3) with hangers (6) being fixed at a plurality of suspension points (6') uniformly distributed in a two-dimensional fashion over an entire extension surface of the gas inlet organ (7), each of the hangers (6) having a head (6") that is secured to the retaining device (3); and an actively cooled temperature control device (11, 12) arranged between the rear wall of the gas inlet organ (7) and the retaining device (3) as an active heat shield, wherein the actively cooled temperature control device (11, 12) is configured to stabilize a temperature of the retaining device (3), is secured to the hangers (6), and extends over the entire extension surface of the gas inlet organ (7), wherein the rear wall of the gas inlet organ (7) is arranged between the actively cooled temperature control device (11, 12) and the front wall of the gas inlet organ (7).

2. The CVD or PVD coating device of claim 1, wherein the actively cooled temperature control device (11, 12) has temperature control medium channels (12).

3. The CVD or PVD coating device of claim 1, wherein the retaining device (3) has mechanical stabilization elements (4, 5).

4. The CVD or PVD coating device of claim 1, wherein the retaining device (3) consists of a retaining frame exhibiting vertical walls (4, 5) interconnected at vertical connection lines.

5. The CVD or PVD coating device of claim 1, wherein the retaining device (3) is secured to the housing (1) exclusively at a horizontal edge (3') of the retaining device (3).

6. The CVD or PVD coating device of claim 1, wherein the retaining device (3) is secured to the housing (1) with elastic fastening means (13, 14).

7. The CVD or PVD coating device of claim 1, wherein the hangers (6) are distributed over an entirety of a horizontal extension surface (20) of the retaining device (3), wherein the hangers (6) extend in a vertical direction from the suspension points (6') of the gas inlet organ (7) to the retaining device (3).

8. The CVD or PVD coating device of claim 1, wherein one or more heat shields (10) are arranged in a vertical space between the gas inlet organ (7) and the retaining device (3).

9. The CVD or PVD coating device of claim 8, wherein the one or more heat shields includes the actively cooled temperature control device (11) arranged immediately adjacent to the retaining device (3).

10. The CVD or PVD coating device of claim 7, wherein two of the suspension points (6') which are located immediately adjacent to one another are spaced apart from each other at most by one fifth of a circle equivalent diagonal of the gas inlet organ (7).

11. The CVD or PVD coating device of claim 1, wherein the retaining device (3) comprises a plurality of cells, each of the cells having cell walls (4, 5) extending in a vertical direction and a horizontal cell surface, wherein an area of the horizontal cell surface measures at most one percent of a base area of the retaining device (3).

12. The CVD or PVD coating device of claim 7, wherein the actively cooled temperature control device (11, 12) comprises a plate whose surface extension corresponds to the horizontal extension surface (20) of the retaining device (3) or the extension surface of the gas inlet organ (7).

* * * * *